United States Patent
Londergan et al.

(10) Patent No.: US 6,905,547 B1
(45) Date of Patent: Jun. 14, 2005

(54) METHOD AND APPARATUS FOR FLEXIBLE ATOMIC LAYER DEPOSITION

(75) Inventors: Ana R. Londergan, Campbell, CA (US); Thomas E. Seidel, Sunnyvale, CA (US); Lawrence D. Matthysse, San Jose, CA (US); Ed C. Lee, Cupertino, CA (US)

(73) Assignee: Genus, Inc., Sunnyvale, CA (US)

( * ) Notice: Subject to any disclaimer, the term of this patent is extended or adjusted under 35 U.S.C. 154(b) by 87 days.

(21) Appl. No.: 10/175,556

(22) Filed: Jun. 17, 2002

Related U.S. Application Data

(63) Continuation of application No. 10/026,354, filed on Dec. 21, 2001, now abandoned.
(60) Provisional application No. 60/257,823, filed on Dec. 21, 2000.

(51) Int. Cl.[7] .................. C23C 16/00; C23C 16/455
(52) U.S. Cl. ......................................... 118/715
(58) Field of Search ............................... 118/715

(56) References Cited

U.S. PATENT DOCUMENTS

| | | | | |
|---|---|---|---|---|
| 4,147,571 A | * | 4/1979 | Stringfellow et al. | 117/104 |
| 4,615,756 A | * | 10/1986 | Tsujii et al. | 156/345.35 |
| 4,798,166 A | * | 1/1989 | Hirooka et al. | 118/719 |
| 4,907,534 A | * | 3/1990 | Huang et al. | 118/725 |
| 4,911,101 A | * | 3/1990 | Ballingall et al. | 118/715 |
| 4,980,204 A | * | 12/1990 | Fujii et al. | 117/98 |
| 5,085,885 A | * | 2/1992 | Foley et al. | 427/575 |
| 5,119,760 A | * | 6/1992 | McMillan et al. | 118/722 |
| 5,270,247 A | * | 12/1993 | Sakuma et al. | 117/89 |
| 5,496,408 A | * | 3/1996 | Motoda et al. | 118/715 |
| 5,503,105 A | * | 4/1996 | Sakuma | 117/88 |
| 5,702,532 A | * | 12/1997 | Wen et al. | 118/730 |
| 5,711,811 A | * | 1/1998 | Suntola et al. | 118/719 |
| 5,788,778 A | * | 8/1998 | Shang et al. | 134/1 |
| 5,792,272 A | * | 8/1998 | van Os et al. | 118/723 R |
| 5,879,459 A | * | 3/1999 | Gadgil et al. | 118/715 |
| 6,143,659 A | * | 11/2000 | Leem | 438/688 |
| 6,155,289 A | * | 12/2000 | Carlsen et al. | 137/457 |
| 6,200,893 B1 | * | 3/2001 | Sneh | 438/685 |
| 6,293,995 B2 | * | 9/2001 | Wilson | 95/23 |
| 6,333,272 B1 | * | 12/2001 | McMillin et al. | 438/710 |
| 6,432,205 B1 | * | 8/2002 | Lee et al. | 118/715 |
| 6,503,330 B1 | * | 1/2003 | Sneh et al. | 118/715 |
| 6,539,891 B1 | * | 4/2003 | Lee et al. | 118/723 E |
| 2002/0020429 A1 | * | 2/2002 | Selbrede et al. | 134/1.1 |
| 2002/0108570 A1 | * | 8/2002 | Lindfors | 118/715 |

FOREIGN PATENT DOCUMENTS

| | | | |
|---|---|---|---|
| FI | 2000-0000899 A | * | 4/2000 |
| JP | 63-38581 | * | 2/1988 |

* cited by examiner

Primary Examiner—Jeffrie R. Lund
(74) Attorney, Agent, or Firm—Blakley Sokoloff Taylor & Zafman LLP

(57) ABSTRACT

An apparatus with a processing chamber subjects a substrate to atomic layer deposition and deposits a film layer. The processing chamber includes at least a first gas switching port. A gas switching manifold is coupled to the processing chamber and configured to mix reactants with a neutral carrier gas and provide gas switching functionality for ALD processes. An upstream gas source and pressure setting apparatus is coupled to the gas switching manifold. The upstream gas source and pressure setting apparatus includes at least a first reactant source, a second reactant source and a neutral gas source. Additionally, the upstream gas source and pressure setting apparatus is configured to provide a cascade of continuing, decreasing pressures.

74 Claims, 8 Drawing Sheets

METHOD AND APPARATUS FOR FLEXIBLE ATOMIC LAYER DEPOSITION

CROSS-REFERENCE TO RELATED APPLICATIONS

This applications a continuation of U.S. application Ser. No. 10/026,354, filed on Dec. 21, 2001 now abandoned, which claims the benefit of U.S. Provisional Application Ser. No. 60/257,823, filed Dec. 21, 2000, which are fully incorporated herein by reference in their entirety.

FIELD OF THE INVENTION

This invention relates generally to atomic layer deposition apparatus and methods, and more particularly to atomic layer deposition apparatus and methods that utilize rapid gas switching hardware and software.

DESCRIPTION OF THE RELATED ART

In the manufacture of integrated circuits, various techniques allow for the deposition of thin films of pure and compound materials. One technique for deposition of thin films is chemical vapor deposition (CVD), which has proven to have superior ability to provide coating uniformity. CVD can provide conformal deposition into vias over high-aspect structures and other uneven features. As device density continues to increase and thinner material layers are desired for deposition, current CVD techniques are challenged to provide the desired improvement of conformality, uniformity, and thickness control.

A process known as Atomic Layer Deposition (ALD) has emerged as a promising technology to extend the abilities of CVD techniques. Presently, ALD is under rapid development to deposit ultrathin material layers on various substrates.

ALD is a process wherein chemical exposure processes are divided into single mono-layer deposition steps, and each separate deposition step theoretically goes into saturation at a single molecular or atomic layer thickness and self-terminates. The self-limiting, saturation or self-termination of the reactants is responsible for a number of beneficial effects including perfect film conformality over high aspect ratio structures, layer by layer growth and the ability to alloy (mix elements) at the atomic level and layer one compound material or elemental material on another.

For typical ALD applications, each molecular precursor (reactant) is introduced into the ALD processing chamber at different times. For example, the first reactant (A) could be a metal precursor containing a metal element M, which is bonded to x number of atomic or molecular ligands L, to form a volatile molecule $ML_x$. The metal precursor reacts with the substrate to deposit a monolayer of the metal M with its passivating ligand. The chamber is subsequently purged. This is followed by an introduction of a second reactant (B). The second reactant is introduced to restore the surface reactivity towards the first precursor for depositing the next layer. Next, the chamber is again purged to remove the excess second precursor prior to the start of the next cycle with the introduction of the first precursor.

A typical ALD reaction is noted as $AH + ML_x \rightarrow AML_y + (x-y)HL$, where HL is the reaction by-product (the x and y subscripts are utilized herein to denote integers 1, 2, 3, etc.).

The sequence of surface reactions that deposits a monolayer or a fraction of a monolayer and restores the surface to the initial point is called the ALD deposition cycle. For example, ALD cycle is the time necessary to complete the reactant A pulse, purge, reactant B pulse, purge sequence shown in FIG. 1. ALD deposited film layers may be deposited in equal metered sequences that can be identical in chemical kinetics, composition, and thickness. Self-saturating surface reactions make ALD relatively insensitive to transport non-uniformity, either from flow engineering or surface topography (i.e. deposition into high aspect ratio structures).

Today there are developing variants of the ALD process. ALD may be initiated by physical adsorption (PS-ALD), or chemical adsorption (CS-ALD), or chemically reactive surface processes (RS-ALD). Once initiated, ALD can proceed using the above described thermally activated (A/B) sequential process. Additionally, plasma assisted ALD processes may be practiced and these may also be initiated in different ways. All of these processes are ALD processes.

Although ALD is a promising technology to deposit ultrathin film layers, the practical implementation of ALD technology is difficult to achieve. High throughput ALD systems dictate that their chemical delivery be achieved by quick and efficient delivery of chemicals with short memory effects. Thus, the utilization of ALD in high performance device manufacturing generally will require equipment specially designed for delivering chemicals to the ALD process chamber in a manner to obtain desired operating results.

Existing designs of CVD reactors and/or chemical delivery systems do not accommodate rapid compositional changes and valve switching for pulsing. Therefore, new ALD gas manifolds and new gas source apparatus are needed and should not rely on existing equipment, architecture and methods. An inherent difficulty results from the need to deal with many different reactive chemicals and with volatility ranging across many orders of magnitude and, therefore, forcing the gas manifolds to be able to control orders of magnitude of fractional mixes with inert carrier gas.

Furthermore, the different precursors used in ALD deposition may have vapor pressure that differs drastically in value. For example, a liquid precursor may be in the range of 5–100 Torr vapor pressure, while gas precursors may be in the range of 1 atmosphere vapor pressure. Some precursors may have very low vapor pressure at room temperature. For example, in the milliTorr (mTorr) range.

When wide pressure-ranges exist, difficulties may be encountered with current CVD and ALD reactors and chemical mixing manifolds. Gas chemicals and high vapor pressure liquid chemicals that can be delivered from a remote location may require substantial dilution. In contrast, low vapor pressure chemicals, such as solid chemical precursors, may require substantial elevated temperatures to obtain concentrations in the desired range.

There is a need for an ALD apparatus, and its method of use, that allows rapid gas switching of a large number of precursor source materials having a large range of vapor pressures. There is further need for an ALD apparatus, and its method of use, that can be utilized to make multi-component films and nanolaminates without throughput limitations as a result of switching from one component to the other. There is further need for an ALD apparatus, and its method of use,.that can be utilized to make multi-component ALD films under stable process chamber pressure conditions resulting in low particle performance. Yet there is another need for an ALD apparatus, and its method of use, that provides superior control of film uniformity and repeatability. There is another need for an ALD apparatus, and its method of use, that provides efficient precursor utilization to achieve high throughput, extending the periods between maintenance cycles and low cost of ownership.

SUMMARY

Accordingly, an object of the present invention is to provide an ALD apparatus, and its method of use, that allows rapid gas switching of a large number of precursor source materials having a large range of vapor pressures.

Another object of the present invention is to provide an ALD apparatus, and its method of use, that can be utilized to make multi-component films and nanolaminates without throughput limitations as a result of switching from one component to the other.

Yet another object of the present invention is to provide an ALD apparatus, and its method of use, that can be utilized to make multi-component ALD films under stable process chamber pressure conditions, resulting in low particle performance.

Still a further object of the present invention is to provide an ALD apparatus, and its method of use, that provides superior control of film uniformity and repeatability.

Another object of the present invention is to provide an ALD apparatus, and its method of use, that provides efficient precursor utilization to achieve high throughput, extending the periods between maintenance cycles and low cost of ownership.

Yet another object of the present invention is to provide an ALD apparatus, and its method of use, that includes an upstream gas source and pressure setting apparatus configured to provide a cascade of continuing, decreasing pressures.

These and other objects of the present invention are achieved in an apparatus with a processing chamber to subject a substrate to atomic layer deposition and deposit a film layer. The processing chamber includes at least a first gas switching port. A gas switching manifold is coupled to the processing chamber and configured to mix reactants with a neutral carrier gas and provide gas switching functionality for ALD processes. An upstream gas source and pressure setting apparatus is coupled to the gas switching manifold. The upstream gas source and pressure setting apparatus includes at least a first reactant source, a second reactant source and a neutral gas source. Additionally, the upstream gas source and pressure setting apparatus is configured to provide a cascade of continuing, decreasing pressures.

In another embodiment of the present invention, an apparatus has a processing chamber to subject a substrate to atomic layer deposition and deposit a film layer. The processing chamber includes at least a first gas switching port. A gas switching manifold is coupled to the processing chamber, configured to mix reactants with a carrier gas, and provide gas switching of at least 70 milliseconds or less and functionality for ALD processes. An upstream gas source and pressure setting apparatus is coupled to the gas switching manifold. The upstream gas source and pressure setting apparatus includes at least a first reactant source, a second reactant source and a neutral gas source.

In another embodiment of the present invention, an apparatus has a processing chamber to subject a substrate to atomic layer deposition and deposit a film layer. The processing chamber includes at least a first gas switching port. A gas switching manifold is coupled to the processing chamber, and configured to mix reactants with a neutral carrier gas and provide gas switching functionality for ALD processes. An upstream gas source and pressure setting apparatus coupled to the gas switching manifold, the upstream gas source and pressure setting apparatus includes at least a first reactant source, a second reactant source and a neutral gas source. The upstream gas source and pressure setting apparatus is configured to provide a continuous decrease of pressure along gas conduit routes.

In another embodiment of the present invention, an apparatus has a processing chamber to subject a substrate to atomic layer deposition and deposit a film layer. The processing chamber includes at least a first gas switching port and has an independently controlled reaction space. A gas switching manifold is coupled to the processing chamber and is configured to mix reactants with a neutral carrier gas and provide gas switching functionality for ALD processes. An upstream gas source and pressure setting apparatus is coupled to the gas switching manifold. The upstream gas source and pressure setting apparatus includes at least a first reactant source, a second reactant source and a neutral gas source.

In another embodiment of the present invention, a method of ALD processing includes providing an apparatus that has a processing chamber. The processing chamber subjects a substrate to atomic layer deposition in order to deposit a film layer. A gas switching manifold is coupled to the processing chamber and is configured to mix reactants with a neutral carrier gas, and provide gas switching functionality for ALD processes. An upstream gas source and pressure setting apparatus includes at least a first reactant source, a second reactant source and a neutral gas source. The upstream gas source and pressure setting apparatus is configured to provide a cascade of continuing, decreasing pressures. A film is then created in the apparatus using an ALD process.

In another embodiment of the present invention, a method of ALD processing includes providing an apparatus with a processing chamber that subjects a substrate to atomic layer deposition in order to deposit a film layer. A rapid gas switching manifold is coupled to the processing chamber and is configured to mix reactants with a carrier gas. The rapid gas switching manifold provides rapid gas switching of at least 70 milliseconds or less as well as functionality for ALD processes. An upstream gas source and pressure setting apparatus includes at least a first reactant source, a second reactant source and a neutral gas source. A film is then created in the apparatus using an ALD process.

In another embodiment of the present invention, a method of ALD processing provides an apparatus that includes a processing chamber that subject a substrate to atomic layer deposition in order to deposit a film layer. The processing chamber includes at least a first gas switching port and has an independently controlled reaction space. A gas switching manifold is coupled to the processing chamber and is configured to mix reactants with a neutral carrier gas and provide gas switching functionality for ALD processes. An upstream gas source and pressure setting apparatus includes at least a first reactant source, a second reactant source and a neutral gas source. A film is then created in the apparatus using an ALD process.

DETAILED DESCRIPTION OF THE PREFERRED EMBODIMENTS

Figure 1:
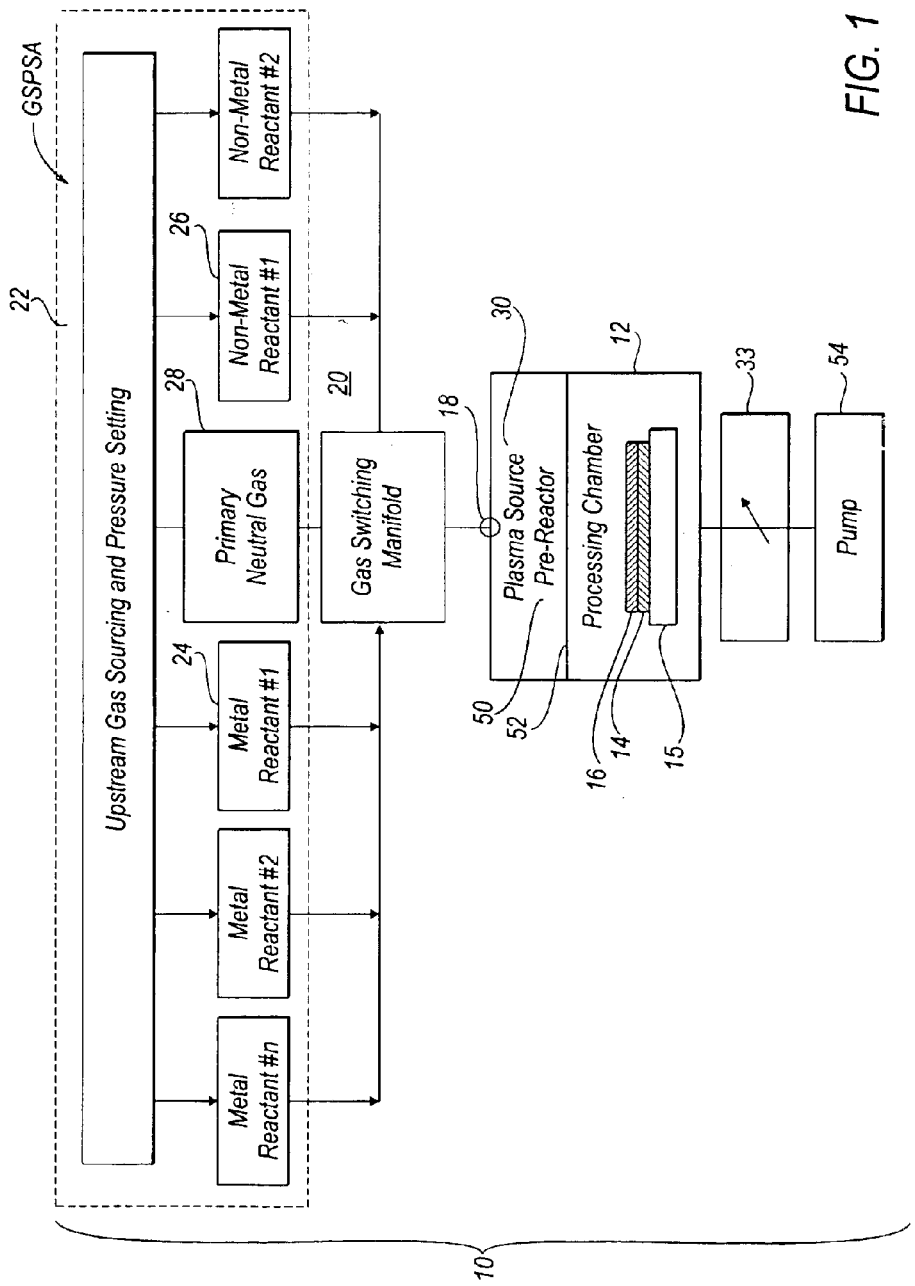
FIG. 1 is a block diagram showing the architecture of one embodiment of an ALD apparatus of the present invention.

Referring to FIG. 1, one embodiment of the present invention is an apparatus, generally denoted as 10, that has a processing chamber 12 to subject a substrate 14 positioned on a heated susceptor 15 in processing chamber 12 to atomic layer deposition processes, combination ALD/CVD processes and the like. ALD processes are utilized to create a film layer 16 on substrate 14. Substrate 14 can be a semiconductor, metal, insulator and the like. The thin films deposited can be elemental materials, compounds of metal oxides or nitrides and alloys, mixtures and nanolaminates of the same.

Processing chamber 12 has at least a first gas inlet port 18. Processing chamber 12 can have an independently controlled processing pressure and an independently controlled reaction volume. The reaction pressure can be controlled by the balance of the upstream pressure controlling injection mechanism and a dominant downstream pressure controlling mechanism. The reaction volume can be controlled by a vertically adjustable heated susceptor 15 upon which substrate 14 rests.

A gas switching manifold 20 can be coupled to processing chamber 12 through inlet port 18. Gas switching manifold 20 mixes reactants with a primary neutral carrier gas. This provides gas switching functionality for ALD processes including but not limited to, reactant(s) and purge(s) gas times, process pressures, plasma sourcing, and the like.

Figure 2:
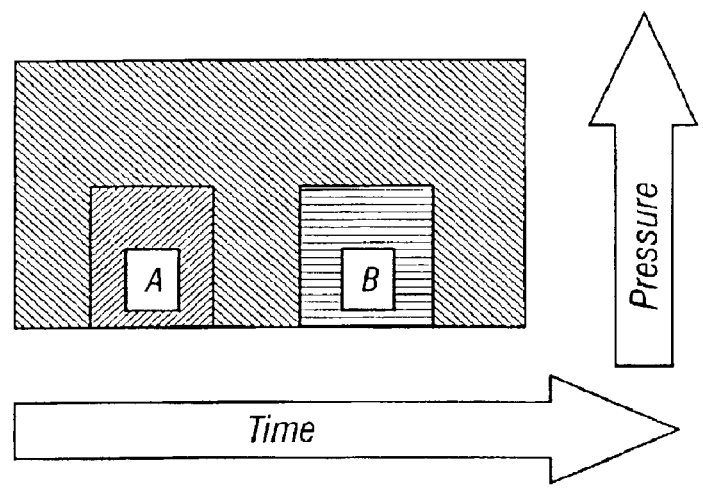
FIG. 2 is graph that illustrates continuous flow of a neutral primary gas and the separation of the A and B reactants to practice ALD utilizing the methods and apparatus of the present invention.

An upstream gas source and pressure setting apparatus (GSPSA) 22 is coupled to gas switching manifold 20. Upstream GSPSA 22 includes at least a first reactant source 24, at least a second reactant source 26 and a primary neutral gas source 28. For purposes of illustration, and without limitation, it will be appreciated that first reactant source 24 can be a metal, and second reactant source 26 can be non-metal. The gas sourcing architecture and position of upstream GSPSA 22 provides an ability to inject reactant gases or diluted reactant gases into a primary neutral carrier stream 28 that establishes the basis for flow and stable total pressure (substantially constant) within processing chamber 12. Sources 24, 26 and 28, as well as any additional sources, can be gases or vapors from liquids or solid type sources. FIG. 2 illustrates the stability of flow and total pressure during reactant pulsing ALD deposition.

Figure 3:
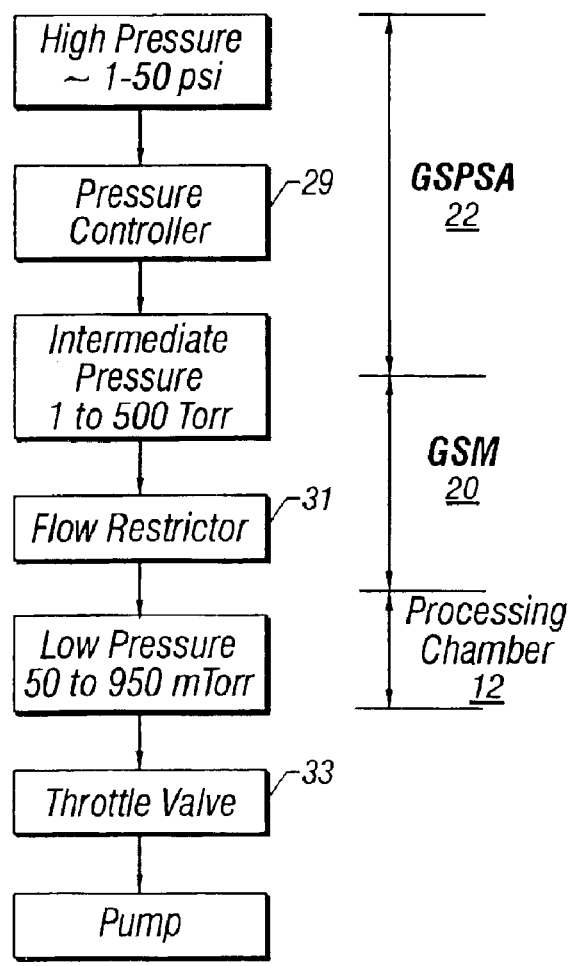
FIG. 3 is a block diagram that illustrates management of cascading pressure used in the FIG. 1 apparatus.

In one embodiment, upstream GSPSA 22 provides a continuous decrease of pressure, also known as a cascading (a cascade of continuing, decreasing pressures of pressure), along gas conduit routes that are coupled to processing chamber 12. For example, as illustrated in FIG. 3, within GSPSA 22, the pressures are generally reduced from the range of ~1–50 psi to the range of ~1–500 torr. This can be achieved with devices including but not limited to a pressure controller 29. The pressure range in gas switching manifold 20 is in the range ~1–100 torr. Pressures in processing chamber 12 can be in the range of ~50–950 millitorr.

In FIG. 3, one or more pressure controllers 29 can be utilized to control the flow of gases throughout apparatus 10. Pressure controllers 29 can apply a pressure sensor and a feedback controlled proportional valve to control the pressure in a given volume. Flow is controlled by the pressure behind a well-defined flow restrictor, such as orifice 31. Additionally, the internal orifices of pressure controllers 29 that are used are selected to accommodate the average, rather than the transient flow. These provisions ensure fast and stable response of the flow element. A downstream throttle valve 33 can be utilized to establish a substantially constant pressure in processing chamber 12 during the ALD cycles.

Referring again to FIG. 1, gas switching manifold 20 can be a rapid gas switching manifold that provides rapid gas switching of at least 70 milliseconds or less. However, rates less than a few milliseconds may not reduce the overall ALD cycle time because typical pulse ALD saturation times can be significantly more than a few milliseconds.

In one embodiment of the present invention, vertical flow of reactants, neutral gases and other species is provided across substrate 14. Vertical flow can be achieved by balancing pressures upstream and downstream from processing chamber 12 Vertical flow provides a number of advantages including but not limited to use of (i) a suitably modified conventional LPCVD reactor, (ii) incorporation of a vertically placed pre-reactor, as discussed below, prior to processing chamber 12 that reduces traces of parasitic CVD due to parasitic premixed chemicals, (iii) a cylindrically symmetric plasma electrode system, (iv) a vertically movable wafer and susceptor plane to optimize throughput, stability and maintain symmetry against second order parasitic effects, and (v) a backside gas or a recessed susceptor, or a combination thereof to avoid the parasitic backside deposition of ALD layers and parasitic CVD.

These vertical flow benefits are utilized relative to the design and implementation of an optimized manifold that is upstream from process chamber 12 along with considerations of process stability and enhanced throughput. Vertical flow is achieved with a rapid gas switching manifold 20, providing rapid gas composition change, while the pressure and total flow, defined as carrier gas flow plus admixture of reactants over substrate 14 is constrained to be essentially constant. Rapid gas switching manifold 20 also protects against particle generation under the constraint that the pressure in process chamber 12 remains stable.

A plasma source 30 is coupled to processing chamber 12. Plasma source 30 can be internally generated and integrated as a remote plasma with respect to substrate 14 but still remaining as an element of processing chamber 12. Alternatively, a plasma can be remotely generated in a separate apparatus that is coupled to processing chamber 12 through a second port 34, or alternately coupled to gas switching manifold 20.

Plasma source can be a cylindrically symmetric plasma electrode system. The plasma is utilized for a variety of purposes including, surface activation, participation of radical assisted sequential CVD, or plasma assisted ALD. A process sequence can be utilized that has an activated surface in order to achieve improved conformality and more ideal ALD by radical assisted process. Plasma 30 can also be utilized for in-situ film densification. In one embodiment, the plasma electrode system can also provide the function of the pre-reactor, as described hereafter.

Figure 4A:
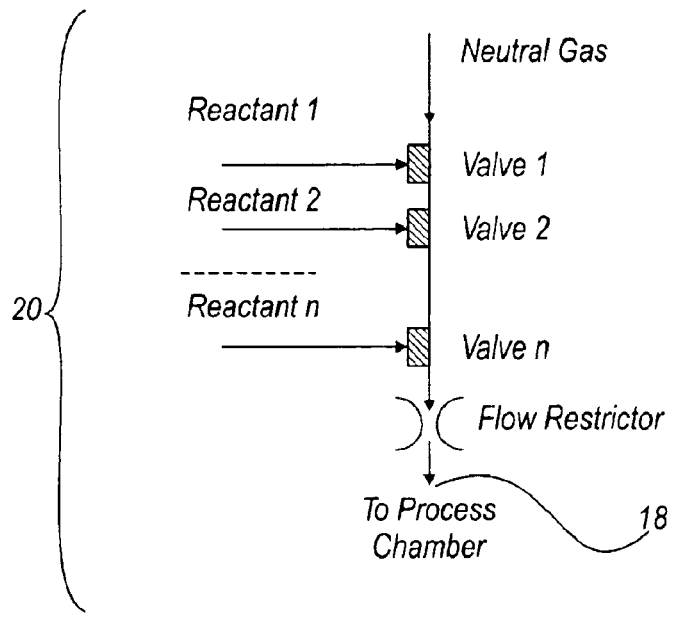
FIG. 4(a) illustrates one embodiment of a gas switching manifold utilized with the FIG. 1 apparatus.
Figure 4B:
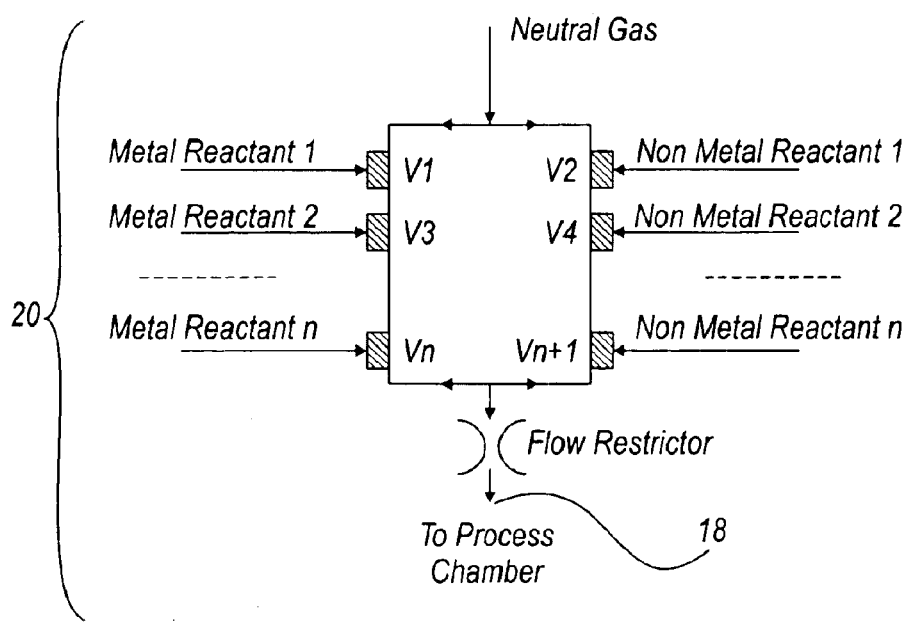
FIG. 4(b) illustrates another embodiment of a gas switching manifold utilized with the FIG. 1 apparatus.

In one embodiment, gas switching manifold 20 includes only a single injection port 18 as shown in FIGS. 4(a) and 4(b), that introduces all reactant and neutral species into processing chamber 12. As illustrated in the embodiment of FIG. 4(b), the metal and non-metal reactants can be introduced in separate branches that merge together above input port 18 of processing chamber 12. The embodiment illustrated in FIG. 4(b) reduces the possibility of cross-contamination, backstreaming, and valve failure due to undesirable parasitic reactions of residual reactants in gas switching manifold 20.

Figure 5A:
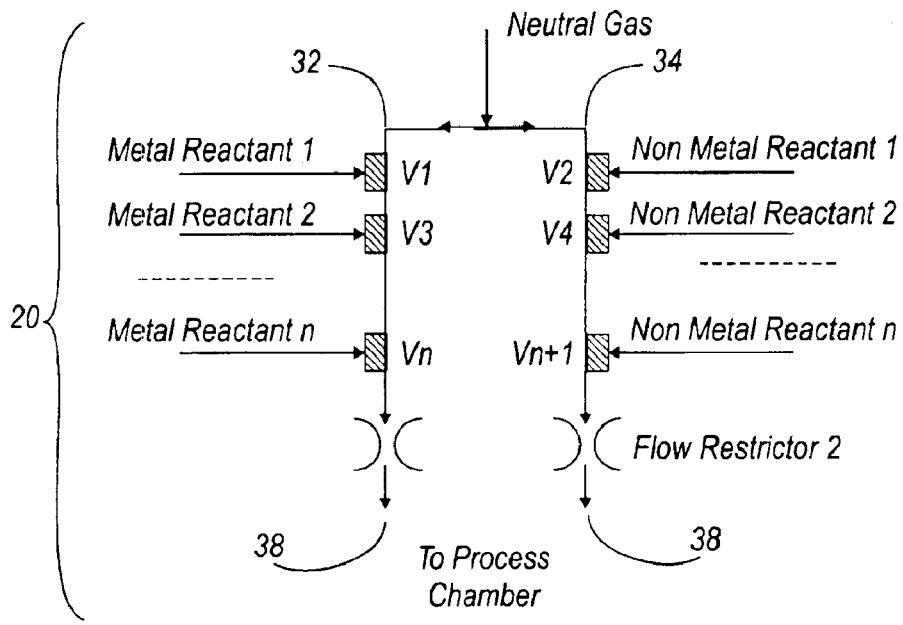
FIG. 5(a) illustrates one embodiment of a gas switching manifold of the present invention utilizing two branches and two ports into the processing chamber.
Figure 5B:
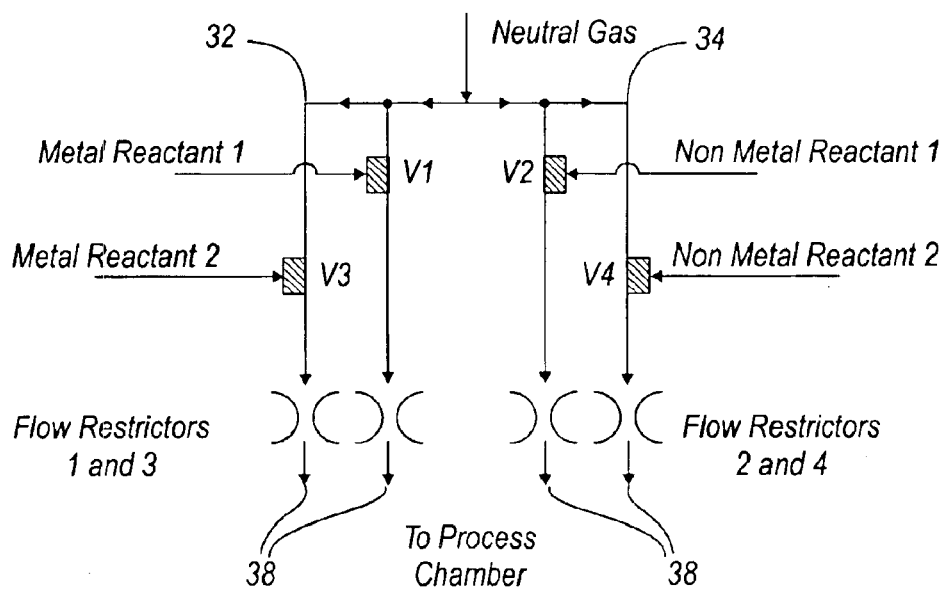
FIG. 5(b) illustrates another embodiment of a gas switching manifold of the present invention utilizing multiple branches and associated ports into the processing chamber.

In another embodiment, gas switching manifold 20 includes a multiple inject port 38 that includes at least first and second conduits 32 and 34, respectively as shown in FIG. 5(a). It will be appreciated that more than two conduits can be utilized as illustrated in FIG. 5(b). In one embodiment, each reactant is injected into a separate inlet port in processing chamber 12. By way of example, and without limitation, first conduit 32 can have a metal halide or a metal organic reactant, and second conduit can have a non-metal reactant such as $H_2O$, $NH_3$ and the like. The embodiments illustrated in FIGS. 5(a) and 5(b) are particularly suitable for practicing ALD that have considerable CVD components, such as when enhanced throughput is desired.

Figure 6A:
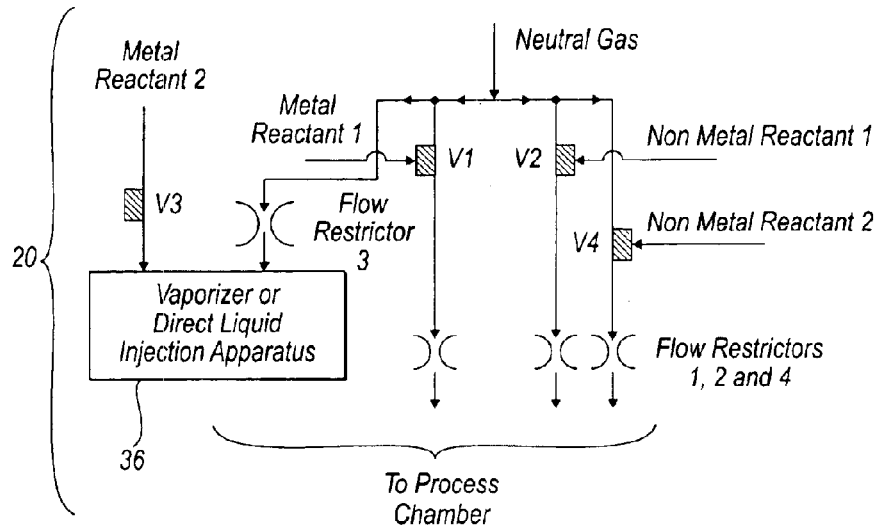
FIG. 6(a) illustrates an embodiment of a gas switching manifold of the present invention that utilizes multiple branches and corresponding ports into the processing chamber with a vaporizer or direct liquid injection apparatus.
Figure 6B:
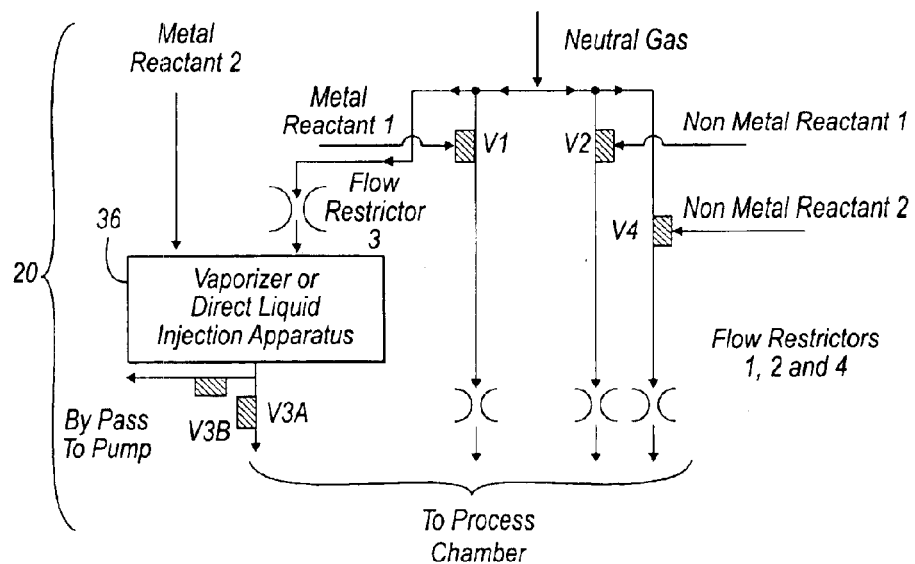
FIG. 6(b) illustrates another embodiment of a gas switching manifold of the present invention that utilizes multiple branches and corresponding ports into the processing chamber with a vaporizer or direct liquid injection apparatus.

As illustrated in FIGS. 6(a) and 6(b), a direct liquid inject or a vaporizer apparatus 36 may be coupled to gas switching manifold 20 for the delivery of low vapor pressure liquid reactants into processing chamber 12. In FIG. 6(a), an embodiment is illustrated that is used when vaporizer apparatus 36 can be turned on and off in times comparable with a typical pulse time in an ALD deposition. In FIG. 6(b), an embodiment is illustrated that is used when vaporizer apparatus 36 can not be turned on and off relative to typical pulse times in ALD deposition and therefore requires provisions for continuous flow to bypass when not being used for pulsing.

In one embodiment, the flow of the primary neutral carrier gas can be interrupted by the use of a shut off valve, and the like, through at least one of the branches of gas switching manifold 20 when a reactant is introduced into this branch during ALD pulse. This embodiment is advantageous for reducing the dilution of low vapor pressure reactant during the pulse if insufficient amount of this reactant is otherwise delivered into processing chamber 12 during a typical pulse time. This is one example of how apparatus 10 can be utilized for efficient chemical utilization in ALD.

Gas switching manifold 20 is configured to provide rapid switching, efficient purging, pressure cascading for stable processing, handling of multiple reactant and neutral gas sources, flexibility for processing of alloys and laminates. The flexibility for processing of alloys and laminates includes rapid switching between different reactants, rapid purging of one reactant before switching to another in fabricating alloys and laminates. Specifically, gas switching manifold 20 is designed to ensure that different reactants do not coexist in significant amounts (e.g., <10 000 ppm) in the gas lines to prevent cross-contamination, particles, and excessive deposition on the gas switching manifold 20.

In one embodiment, gas switching manifold 20 or its conduit and valve components are heated. Heating the components prevents condensation of the reactants and ensures low residence time of the reactants in the conduits. Temperature zones can be defined along the gas switching manifold 20 where the temperature increases from upstream GSPSA 22 towards processing chamber 12. The upper limit of the temperature is defined by the thermal stability of the reactant with the lowest decomposition temperature. This ensures that the reactant does not undergo premature decomposition. For processes where one of the reactants requires heating to a temperature to generate sufficient vapor pressure, the components of gas switching manifold 20 that are downstream from the port where this reactant is introduced must be heated to temperatures higher than the sublimation temperature.

Figure 7A:
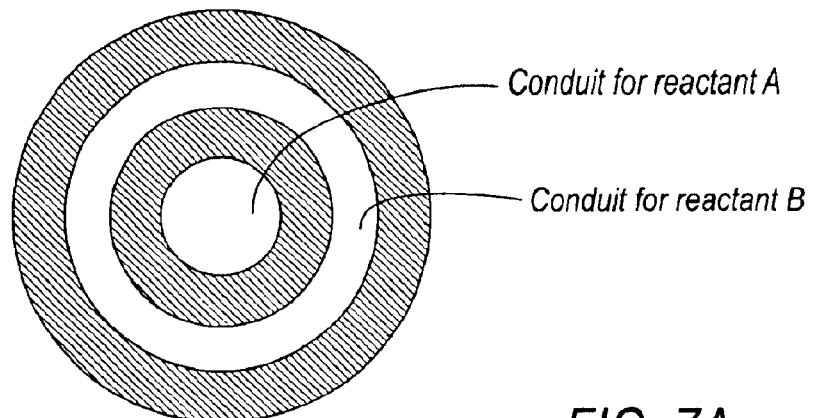
FIG. 7(a) is a cross-sectional view of a coaxial port, with two conduits for two reactants utilized with the FIG. 1 apparatus.
Figure 7B:
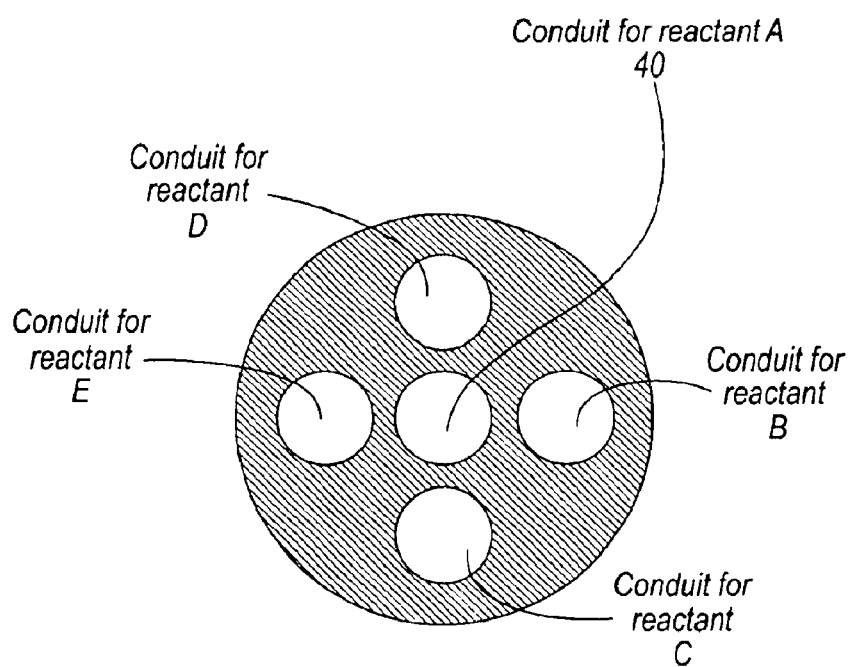
FIG. 7(b) illustrates a cross-section of a multi-port, with a plurality of conduits that can be utilized with the FIG. 1 apparatus.

Referring to FIG. 7(a), first and second conduits 32 and 34, as shown in FIG. 5(a) can be arranged to be co-axial with respect to each other. Additionally, multiple injection port 38 can be arranged with axial symmetry around a central conduit 40 as shown in FIG. 7(b). Alternatively, multiple injection port 38 can also include the plurality of conduits arranged nonaxially with respect to a center of symmetry of processing chamber 12.

The valve components of gas switching manifold 20 are selected to provide, (i) rapid actuation, (ii) compatibility with operation temperature, and (iii) high flow conductance and minimal dead space.

Apparatus 10 can include a separate software and controls processing unit for gas switching manifold 20 in order to ensure rapid communication with its valves. This allows the programming and rapid execution of complex valve sequencing commands and ensures that pressures and flows are maintained stable and reduces back-streaming or pressure bursts. With a rapid processing time, the valve response time is typically limited by the response time of the valve actuators.

Gas switching manifold 20 can be configured to provide (i) continuous purging with a primary neutral gas, (ii) minimal dead volume between reactant inlet valves and the main conduit of the gas switching manifold 20, (iii) purge capability for all reactants, (iv) introduction of reactants through a separate ports and associated valves into the main conduit of gas switching manifold 20. These provide flexibility for deposition of alloys and nanolaminates with a minimal impact on throughput.

Figure 8:
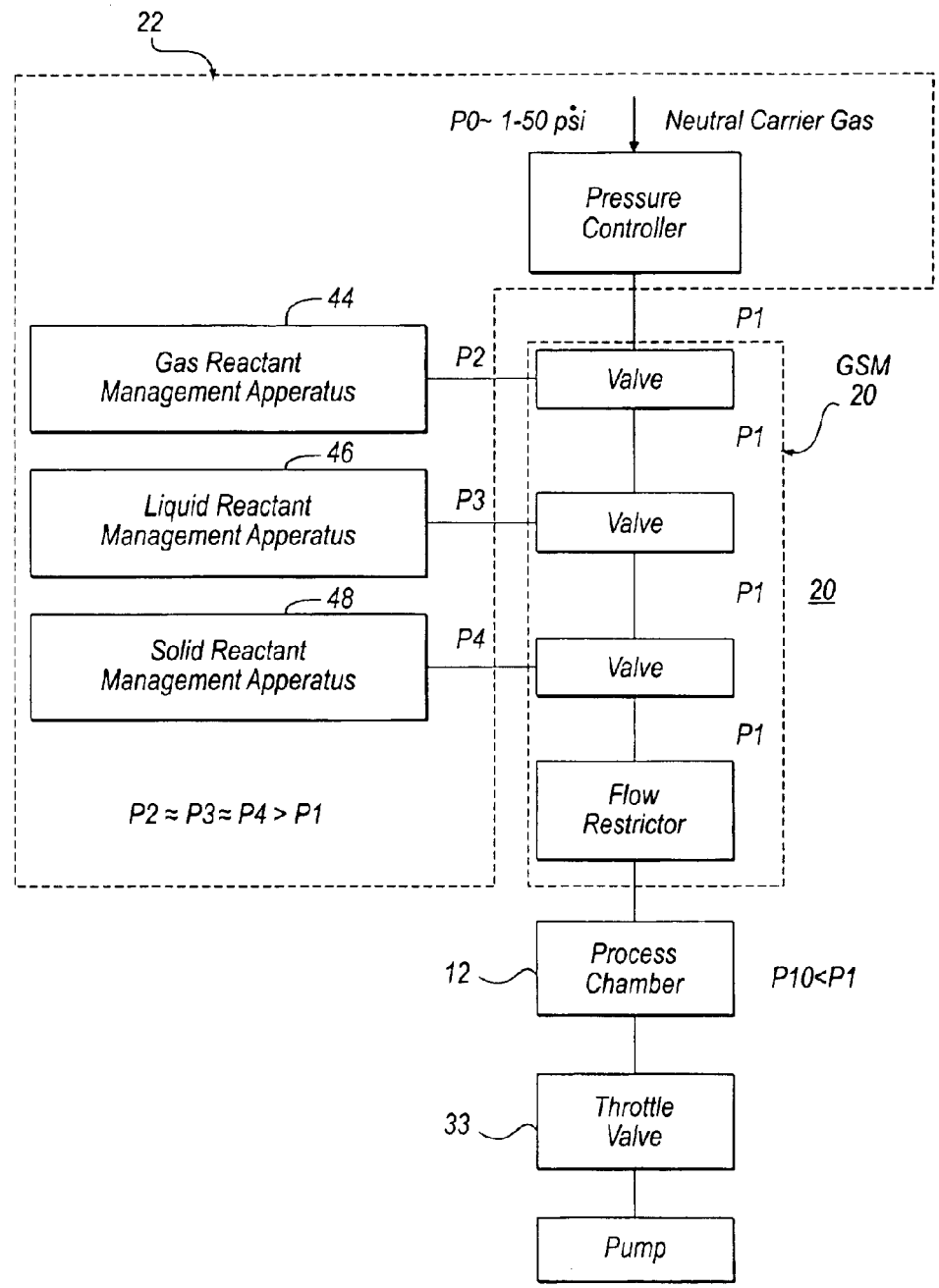
FIG. 8 is a block diagram illustrating the management of various gas, liquid and solid source reactants in one embodiment of the present invention.

As previously described, GSPSA 22 provides a cascading of pressure. As shown in FIG. 8, GSPSA 22 can be configured to provide, (i) a stable pressure P1 in a main conduit of gas switching manifold 20 by flowing of a primary neutral gas, and (ii) management of gas, liquid and solid reactants so they are introduced into gas switching manifold 20 at pressures higher than P1 by a value in the range of 2 to 8 torr for P1 in the range of 10 to 80 torr, where the value can be defined as less than 25% of P1. By way of illustration, as shown in FIG. 8, a gas reactant management apparatus 44 is utilized for reduction and control of the gas reactant to P2, which is higher than P1, at the port of entry into gas switching manifold 20. Alternatively, this gas reactant management apparatus 44 can dilute gas reactants by mixing with a secondary neutral carrier gas to enhance chemical utilization. In similar manner, a liquid reactant management apparatus 46 can be utilized to provide a mixture of liquid reactant vapors and a secondary neutral carrier gas, and control the pressure of the mixture to a pressure P3 that is greater than P1. Similarly, a solid reactant management apparatus 48 is utilized to provide a mixture of a preheated secondary neutral carrier gas and the vapor from a solid reactant, and control the pressure of the mixture to a pressure P4 that is greater than P1.

One embodiment of apparatus 10 can utilize a plurality of gas, liquid, and solid reactant management apparatus. The number of reactants is determined by the specific application. Additionally, a plurality of neutral gas sources can be employed as primary and secondary carriers to achieve better control and prevent cross-contamination of the reactants in upstream manifolds of apparatus 10. Additionally, the same neutral carrier gas source can be used as a secondary carrier of at lest two reactants.

In one embodiment, apparatus 10 is operating using the sequencing of vapor phase reactants that are introduced through gas switching manifold 20 into processing chamber 12. Each vapor phase reactant provides a half reaction. By way of illustration, and without limitation, the half reactions can be a metal deposition saturated by a halide ligand and then a purge, followed by an exposure for non-metal deposition saturated by a hydride ligand, and then a purge. This can occur while continuously pumping during exposure and the purge.

In one embodiment, processing chamber 12 is a modified conventional vertical flow LPCVD reactor. Processing chamber 12 can be designed to provide a reduced amount of dead leg space. As previously mentioned, vertical flow of gasses over substrate 12 can be provided. Throttle valve 33 may be included to control the pressure in processing chamber 12. Controls can be included that are integrated with gas switching manifold 20 software and safety interlocks. Additionally, processing chamber 12 or more than one processing chamber can be coupled to or integrated with a vacuum cluster wafer transport system as known in the art.

Referring again to FIG. 1, located above substrate 14 there may be a pre-reactor space with a pre-reactor 50 that reduces parasitic CVD and can be used to generate in-situ remote plasma. Pre-reactor 50 includes upstream components, including but not limited to piping and conduits, with surfaces that can be absorbing or heterogeneous for purposes of reacting with the CVD reactant gases. These surfaces of the pre-reactor 50 are positioned at intercepting locations with respect to parasitic CVD reactants to capture CVD components and allow non-mixed (ALD) reactants to reach the substrate 14.

Reactant and neutral gases can be introduced into processing chamber 12 vertically or horizontally with respect to substrate 14 and on separate conduits. Use of separate conduits may reduce upstream reaction and parasitic depositions.

A gas distribution plate 52 can be included with processing chamber 12 and have multiple uses including: (i) distributing gas for ALD deposition, (ii) collecting CVD parasitic deposits, (iii) acting as the electrode for the internally generated plasma.

For optimal distribution of reactant and neutral gases in processing chamber 12, the outer regions of gas distributing plate 52 can have larger open regions with larger radii in order to provide, (i) more rapid exposure of areas of the substrate 14 away form the wafer center, and (ii) more rapid purge of gases. Gas distribution plate 52 does not have to be symmetric for ALD. An open region can be provided on gas distribution plate 52 that is more open in a direction facing a wafer transport valve than other azmuthal regions. This can be achieved with a plurality of open regions with varying sizes or designs.

Additionally, a vertically movable wafer, heater, susceptor plane and pumping conduit can be utilized in order to optimize throughput, stability and maintain symmetry against second order parasitic effects. It also reduces any parasitic dead space effect of the transfer valve port region and eliminates the need for thermal redesign of chamber wall surface temperature in that region to neutralize asymmetric desorption.

Apparatus 10 provides numerous advantages including but not limited to, the ability to effectively alloy elements, make ultra-thin layers of compounds and elements (nanolaminates).

In various applications, the walls and lid of processing chamber 12 and a pump stack 54 are heated to a set temperature in the range of for example 80–200 C., depending on the specific ALD process, to reduce residence time of reactants inside processing chamber 12. This increases throughput and reduces the chance of particle generation.

In one embodiment, $Al_2O_3$ is formed on substrate 12. Switching valve times of gas switching manifold 20 are controllable to a precision in the tens of millisecond range. Exposure times to achieve ALD saturation at operating conditions are typically a fraction of a second ~0.1–1.5 sec and purge times are ~0.2–3 sec and can be longer than the exposure times. This provides a ~2.5 sec or less total cycle time for the deposition of $Al_2O_3$ The thickness of deposition per ALD exposure and purge durations are on the order of ~1/3 of a typical mololayer thickness, which can be 0.8 A for $Al_2O_3$. For $Al_2O_3$, the resultant particle generation can be less than 5 adders and greater than 0.16 um.

Apparatus 10 can be used for the deposition of layers of different compounds or elements with an alternating layer at atomic dimension level including but not limited to alloys and near alloys. An example is the deposition of one ALD layer of $Al_2O_3$ and a next layer of $HfO_2$ or $ZrO_2$. ALD layered atom configurations can be created that are physically similar, if not identical, to alloys. In this instance, the physical similarity can be at least a two dimensional approximation of alloying as compared to three dimensional alloying that is obtained by co-sputter deposition or co-CVD deposition, or by ALD layering film depositions followed by higher temperature anneals. In creating alloy compositions other that 50:50, sequencing the layers can take many non-unique forms. For 66:33, 2 layers can be followed by 1 layer; or 4 layers followed by 2 layers and the physical results may be similar or not.

Alternately, apparatus 10 can be utilized to deposit several layers of one kind of material, e.g. ~10 Å of $Al_2O_3$ followed by another ultrathin layer of another material, e.g. 50 Å of $HfO_2$ or $Ta_2O_5$, or an alloy of Hf—Al—O. This layering is nanolaminates (layered ultrathin films, each with its own longer range order (if crystalline) and coherence. There is a region of transition or mixture between nanolaminate and alloy at 10 Å to 1–3 Å thickness values. For purposes of this disclosure, the average thickness of a monolayer of material, including but not limited to ~3 Å is the cross over point between the two.

Figure 9:
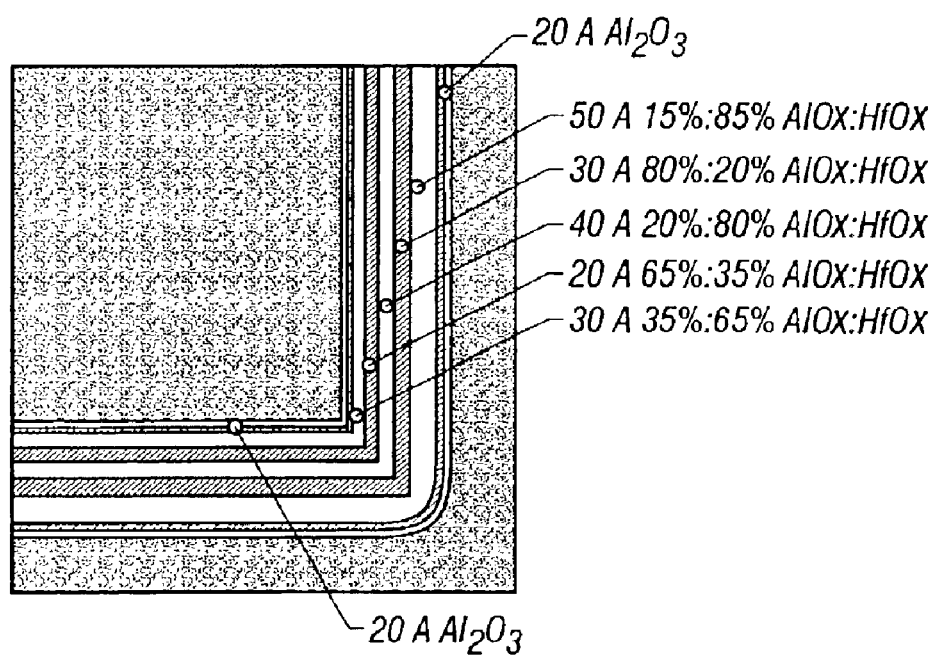
FIG. 9 is a transmission electron microscopy image of a nanolaminate structure made with the FIG. 1 apparatus.

FIG. 9 is a transmission electron microscopy image of a nanolaminate structure consisting of layers of Al2O3 and Al—Hf—O alloys of different composition, deposited on 15:1 aspect ratio trench structures defined in a 200 mm silicon wafer substrate. There is a sharp transition and contrast between light and dark regions. The thickness that one can control layering depends on the thickness of a given ALD deposition per cycle depending on the chemistry used. The image features the bottom corner of one trench structure and exemplifies superb conformality and control of the deposition. The nanolaminate structure was fabricated using apparatus 10 as well as its method of use.

Apparatus 10 provides optimal reactant utilization in practicing ALD deposition of single component films, multi-component alloys and various layer-by-layer and nanolaminate structure. This is achieved , (i) by delivery of an optimal amount of each reactant, solid, gas or liquid, during each and every pulse in the ALD deposition, (ii) with minimal purge time, (iii) without a need for extensive purging of manifold and process chamber between different reactants in alloy or nanolaminate ALD deposition, and (iv) without a need for diverting reactants through a bypass conduit when not used in pulsing. All of these can be achieved by careful cascading pressure management, fast valve switching, optimal dilution of the reactants by mixing with a secondary neutral carrier, minimization of dead space volume and heating the walls of processing chamber 12 and pump stack 54.

Additionally, apparatus 10, and its various method of use, provide for enabling rapid and efficient formation of alloys and nanolaminates. More generally, alloys and nanolaminates can be referred to as composite or combination films. The sequential flow of different metal and non-metal bearing reactants are programmed to flow to and from gas switching manifold 20 to the processing chamber for the purpose of forming alloys or nanolaminates or nanolaminates of alloys. Apparatus 10 can have a parallel source arrangement that provides an ability to efficiently form alloys or nanolaminates of 1, 2, 3 or more compounds. Examples of the formation of combination films include but are not limited to:

alloys including but not limited to: $Al_2O_3/HfO_2$, or $Al_2O/ZrO_2$ or $ZrO_2/HfO_2$ or $Al_2O_3/HfO_2/ZrO_2$, and the like;

nanolaminates: including but not limited to layers of $Al_2O_3$—$HfO_2$, $Al_2O_3$—$HfO_2$—$Al_2O_3$, $Al_2O_3$—$Ta_2O_5$, $Al_2O_3$—$Ta_2O_5$—$Al_2O_3$, and the like;

examples of nanolaminates and alloy films include but are not limited to: $Al_2O_3$—$Al_2O_3/HfO_2$—$Al_2O_3$, and the like.

There are many applications for these different combinations, for example in the area of capacitors and gate stacks for dielectric combination films. Metal nitrides for use in interconnect, electrode barriers and metal gates can also be formed using the parallel multi source architecture. These metal nitride combination films include but are not limited to:

alloys of layers of TiN/WN, TiN/TaN, TaN/WN, or TiN/WN/TiN, and the like;

layers of TiN—WN, TiN—TaN, TaN—WN, and the like;

nanolaminate and alloy films: TiN—TaN/WN—TiN, and the like.

Apparatus 10 permits the dedication of a given processing chamber to provide certain combinations films. The number of parallel sources for combination films can be limited to a particular application. An example is a combination for 3 different films such as $Al_2O_3$, $HfO_2$ and $ZrO_2$, or 2 different films such as $Al_2O_3/HfO_2$ and $Al_2O_3/ZrO_2$ or 2 different films such as TiN and WN.

One of the features of the parallel source architecture may be the use of common piping for different reactants. Additionally, certain reactor surfaces around substrate 14 are exposed to different reactants in multi-film applications.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An apparatus, comprising:

a processing chamber to subject a substrate to atomic layer deposition to deposit a film layer, the processing chamber including at least one inlet port;

a gas switching manifold coupled to the processing chamber and configured to include at least first and second conduits and corresponding at least first and second flow restrictors, wherein a first reactant and a neutral specie stream are mixed in the first conduit and a second reactant and the neutral specie stream are mixed in the second conduit, the first and second conduits in fluid communication downstream from the neutral specie stream and the first and second flow restrictors configured to control flow of mixed reactant from the first and second conduits, respectively, through the at least one inlet port into the processing chamber; and an upstream gas source and pressure setting apparatus including at least a first inject port and a second inject port coupled respectively to the first conduit and the second conduit and respectively to at least a first reactant source and a second reactant source, and including a neutral specie source coupled to provide the neutral specie stream, wherein the upstream gas source and pressure setting apparatus further includes at least one pressure controller configured to provide a cascade of continuing, decreasing pressures to the processing chamber.

2. The apparatus of claim 1, wherein the upstream gas source and pressure setting apparatus is configured to provide a reduction of pressure in the upstream gas source and pressure apparatus from a range of 1 to 50 psi to a range of 1 to 500 torr.

3. The apparatus of claim 1, wherein the gas switching manifold is configured to provide a reduction in pressure in the gas switching manifold in a range of 1 to 100 torr.

4. The apparatus of claim 1, wherein the processing chamber is configured to provide a reduction of pressure in the processing chamber in a range of 50 to 950 millitorr.

5. The apparatus of claim 1, further comprising:

a plasma source coupled to the processing chamber.

6. The apparatus of claim 5, wherein the plasma source is coupled to the gas switching manifold and is included as a component of an output of the gas source and pressure setting apparatus.

7. The apparatus of claim 5, wherein the plasma source is positioned between the gas switching manifold and the processing chamber.

8. The apparatus of claim 1, wherein the processing chamber includes an integral plasma source.

9. The apparatus of claim 1, wherein the processing chamber includes a second port coupled to a plasma source.

10. The apparatus of claim 1, wherein the processing chamber includes a plurality of inlet ports coupled to corresponding outputs of a plurality of flow restrictors coupled to the gas switching manifold.

11. The apparatus of claim 1, wherein the processing chamber includes a single inlet port which introduces all reactant and neutral species into the processing chamber from a single flow restrictor coupled to the gas switching manifold.

12. The apparatus of claim 1, wherein the first and second conduits are co-axial with respect to each other.

13. The apparatus of claim 1, wherein the gas switching manifold includes a plurality of conduits to mix a corresponding plurality of reactants with a neutral specie, the plurality of conduits arranged with axial symmetry around a central conduit.

14. The apparatus of claim 13, wherein the the plurality of conduits include a plurality of corresponding flow restrictors configured to control flow of mixed reactants into the processing chamber.

15. The apparatus of claim 1, wherein the gas switching manifold is configured to provide a vertical flow of reactive and neutral gases relative to a substrate in the processing chamber.

16. The apparatus of claim 15, wherein the gas distribution member is configured to serve as an electrode and generate a plasma in the processing chamber.

17. The apparatus of claim 1, further comprising: a gas distribution member coupled to the processing chamber and configured to provide a desired gas distribution in the reaction chamber.

18. An apparatus, comprising:
a processing chamber to subject a substrate to atomic layer deposition to deposit a film layer, the processing chamber including at least one inlet port;
a gas switching manifold coupled to the processing chamber, the gas switching manifold configured to include at least first and second conduits coupled to corresponding at least first and second flow restrictors and at least first and second valves, wherein a first reactant from the first valve and a neutral specie stream are mixed in the first conduit and a second reactant from the second valve and the neutral specie stream are mixed in the second conduit, the first and second conduits in fluid communication downstream from the neutral specie stream and the first and second flow restrictors configured to control flow of reactants from the first and second conduits, respectively, through the at least one inlet port into the processing chamber, the first and second valves configured to provide rapid switching of at least 70 milliseconds or less for ALD processes; and
an upstream gas source and pressure setting apparatus including at least a first inject port and a second inject port which are coupled respectively to the first conduit and the second conduit and respectively to, at least a first reactant source and a second reactant source, and including a neutral specie source coupled to provide the neutral specie stream.

19. The apparatus of claim 18, wherein the gas switching manifold is configured to provide optimization of chemical usage for ALD processes.

20. The apparatus of claim 18, wherein the upstream gas source and pressure setting apparatus is configured to provide a reduction of pressure in the upstream gas source and pressure apparatus from a range of 1 to 50 psi to a range of 1 to 500 torr.

21. The apparatus of claim 18, wherein the gas switching manifold is configured to provide a reduction in pressure in the gas switching manifold in a range of 1 to 100 torr.

22. The apparatus of claim 18, wherein the processing chamber is configured to provide a reduction of pressure in the processing chamber in a range of 50 to 950 millitorr.

23. The apparatus of claim 18, wherein the gas source and pressure setting apparatus is configured to provide a cascade of continuing, decreasing pressures.

24. The apparatus of claim 18, further comprising:
a plasma source coupled to the processing chamber.

25. The apparatus of claim 18, wherein the plasma source is coupled to the gas switching manifold and is included as a component of an output of the gas source and pressure setting apparatus.

26. The apparatus of claim 18, wherein the plasma source is positioned between the gas switching manifold and the processing chamber.

27. The apparatus of claim 18, wherein the processing chamber includes an integral plasma source.

28. The apparatus of claim 18, wherein the processing chamber includes a second port coupled to a plasma source.

29. The apparatus of claim 18, wherein the processing chamber includes a plurality of inlet ports coupled to corresponding outputs of a plurality of flow restrictors coupled to the gas switching manifold.

30. The apparatus of claim 18, wherein the processing chamber includes a single inlet port which introduces all reactant and neutral species into the processing chamber from a single flow restrictor coupled to the gas switching manifold.

31. The apparatus of claim 18, wherein the first and second conduits are co-axial with respect to each other.

32. The apparatus of claim 18, wherein the gas switching manifold includes a plurality of conduits to mix a corresponding plurality of reactants with a neutral specie, the plurality of conduits arranged with axial symmetry around a central conduit.

33. The apparatus of claim 32, wherein the the plurality of conduits include a plurality of corresponding flow restrictors configured to control flow of mixed reactants into the processing chamber.

34. The apparatus of claim 18, wherein the gas switching manifold is configured to provide a vertical flow of reactive and neutral gases relative to a substrate in the processing chamber.

35. The apparatus of claim 34, wherein the gas distribution member is configured to serve as an electrode and generate a plasma in the processing chamber.

36. The apparatus of claim 18, further comprising:
a gas distribution member coupled to the processing chamber and configured to provide a desired gas distribution in the reaction chamber.

37. An apparatus comprising:
a processing chamber to subject a substrate to atomic layer deposition to deposit a film layer, the processing chamber including at least one inlet port;
a gas switching manifold coupled to the processing chamber and configured to include at least first and second conduits and corresponding at least first and second flow restrictors, wherein a first reactant and a neutral specie stream are mixed in the first conduit and a second reactant and the neutral specie stream are mixed in the second conduit, the first and second conduits in fluid communication downstream from the neutral specie stream and the first and second flow restrictors configured to control flow of mixed reactant from the first and second conduits, respectively, through the at least one inlet port into the processing chamber; and
an upstream gas source and pressure setting including at least a first inject port and a second inject port which are coupled respectively to the first conduit and the second conduit and respectively to, at least a first metal reactant source and a non-metal reactant source, and including a neutral specie source coupled to provide the neutral specie stream, wherein the upstream gas source and pressure apparatus further includes at least one pressure controller configured to provide a continuous decrease of pressure to the processing chamber.

38. The apparatus of claim 37, wherein the gas switching manifold is configured to provide a continuous decrease of pressure along gas conduit routes.

39. The apparatus of claim 37, wherein the upstream gas source and pressure setting apparatus is configured to provide a reduction of pressure in the upstream gas source and pressure apparatus from a range of 1 to 50 psi to a range of 1 to 500 torr.

40. The apparatus of claim 37, wherein the gas switching manifold is configured to provide a reduction in pressure in the gas switching manifold in a range of 1 to 100 torr.

41. The apparatus of claim 37, wherein the processing chamber is configured to provide a reduction of pressure in the processing chamber in a range of 50 to 950 millitorr.

42. The apparatus of claim 37, further comprising:
a plasma source coupled to the processing chamber.

43. The apparatus of claim 42, wherein the plasma source is coupled to the gas switching manifold and is included as a component of an output of the gas source and pressure setting apparatus.

44. The apparatus of claim 42, wherein the plasma source is positioned between the gas switching manifold and the processing chamber.

45. The apparatus of claim 37, wherein the processing chamber includes an integral plasma source.

46. The apparatus of claim 37, wherein the processing chamber includes a second port coupled to a plasma source.

47. The apparatus of claim 37, wherein the processing chamber includes a plurality of inlet ports coupled to corresponding outputs of a plurality of flow restrictors coupled to the gas switching manifold.

48. The apparatus of claim 37, wherein the processing chamber includes a single inlet port which introduces all reactant and neutral species into the processing chamber from a single flow restrictor coupled to the gas switching manifold.

49. The apparatus of claim 37, wherein the first and second conduits are co-axial with respect to each other.

50. The apparatus of claim 37, wherein the gas switching manifold includes a plurality of conduits to mix a corresponding plurality of reactants with a neutral specie, the plurality of conduits arranged with axial symmetry around a central conduit.

51. The apparatus of claim 50, wherein the the plurality of conduits include a plurality of corresponding flow restrictors configured to control flow of mixed reactants into the processing chamber.

52. The apparatus of claim 37, wherein the gas switching manifold is configured to provide a vertical flow of reactive and neutral gases relative to a substrate in the processing chamber.

53. The apparatus of claim 52, wherein the gas distribution member is configured to serve as an electrode and generate a plasma in the processing chamber.

54. The apparatus of claim 37, further comprising:
a gas distribution member coupled to the processing chamber and configured to provide a desired gas distribution in the reaction chamber.

55. An apparatus comprising:
a processing chamber to subject a substrate to atomic layer deposition to deposit a film layer, the processing chamber including at least one inlet port and having an independently controlled reaction space;
a gas switching manifold coupled to the processing chamber and configured to include at least first and second conduits and corresponding at least first and second flow restrictors, wherein a first reactant and a neutral specie stream are mixed in the first conduit and a second reactant and the neutral specie stream are mixed in the second conduit, the first and second conduits in fluid communication downstream from the neutral specie stream and the first and second flow restrictors configured to control flow of mixed reactant from the first and second conduits, respectively, through the at least one inlet port into the processing chamber; and
an upstream gas source and pressure setting apparatus including at least a first inject port and a second inject port which are coupled respectively to the first conduit and the second conduit and respectively to at least a first metal reactant source and a non-metal reactant source, and including a neutral specie source coupled to provide the neutral specie stream.

56. The apparatus of claim 55, wherein the independently controlled reaction space includes an independently controlled processing pressure.

57. The apparatus of claim 55, wherein the independently controlled reaction space includes an independently controlled reaction volume.

58. The apparatus of claim 57, wherein the upstream gas source and pressure setting apparatus is configured to provide a reduction of pressure in the upstream gas source and pressure apparatus from a range of 1 to 50 psi to a range of 1 to 500 torr.

59. The apparatus of claim 57, wherein the gas switching manifold is configured to provide a reduction in pressure in the gas switching manifold in a range of 1 to 100 torr.

60. The apparatus of claim 57, wherein the processing chamber is configured to provide a reduction of pressure in the processing chamber in a range of 50 to 950 millitorr.

61. The apparatus of claim 55, wherein the gas source and pressure setting apparatus is configured to provide a cascade of varying pressures.

62. The apparatus of claim 55, further comprising:
a plasma source coupled to the processing chamber.

63. The apparatus of claim 62, wherein the plasma source is coupled to the gas switching manifold and is included as a component of an output of the gas source and pressure setting apparatus.

64. The apparatus of claim 62, wherein the plasma source is positioned between the gas switching manifold and the processing chamber.

65. The apparatus of claim 55, wherein the processing chamber includes an integral plasma source.

66. The apparatus of claim 55, wherein the processing chamber includes a second port coupled to a plasma source.

67. The apparatus of claim 55, wherein the processing chamber includes a plurality of inlet ports coupled to corresponding outputs of a plurality of flow restrictors coupled to the gas switching manifold.

68. The apparatus of claim 55, wherein the processing chamber includes a single inlet in port which introduces all reactant and neutral species into the processing chamber from a single flow restrictor coupled to the gas switching manifold.

69. The apparatus of claim 55, wherein the first and second conduits are co-axial with respect to each other.

70. The apparatus of claim 55, wherein the gas switching manifold includes a plurality of conduits to mix a corresponding plurality of reactants with a neutral specie, the plurality of conduits arranged with axial symmetry around a central conduit.

71. The apparatus of claim 70, wherein the the plurality of conduits include a plurality of corresponding flow restrictors configured to control flow of mixed reactants into the processing chamber.

72. The apparatus of claim 55, wherein the gas switching manifold is configured to provide a vertical flow of reactive and neutral gases relative to a substrate in the processing chamber.

73. The apparatus of claim 55, further comprising:
a gas distribution member coupled to the processing chamber and configured to provide a desired gas distribution in the reaction chamber.

74. The apparatus of claim 73, wherein the gas distribution member is configured to serve as an electrode and generate a plasma in the processing chamber.

* * * * *